US006257881B1

(12) United States Patent
Fiala et al.

(10) Patent No.: US 6,257,881 B1
(45) Date of Patent: Jul. 10, 2001

(54) COMBINATION CVI/CVD AND HEAT TREAT SUSCEPTOR LID

(75) Inventors: Robert Fiala, Spokane, WA (US); Dary Zeigler, Sun City, CA (US); Darren Welson, Foothill Ranch, CA (US); Jose Del Real, La Puenta, CA (US); James W. Rudolph, Colorado Springs, CO (US)

(73) Assignee: The B.F. Goodrich Company, Charlotte, NC (US)

( * ) Notice: Subject to any disclaimer, the term of this patent is extended or adjusted under 35 U.S.C. 154(b) by 0 days.

(21) Appl. No.: 09/586,220

(22) Filed: Jun. 2, 2000

Related U.S. Application Data

(60) Provisional application No. 60/137,591, filed on Jun. 4, 1999.

(51) Int. Cl.[7] .................................................. F27D 1/18
(52) U.S. Cl. ........................ 432/250; 432/237; 118/715
(58) Field of Search ....................................... 432/237, 238, 432/250, 251, 254.1, 254.2; 118/715, 724, 725; 126/211, 220; 34/62, 66, 83, 393, 394, 428, 433; 165/104.14

(56) References Cited

U.S. PATENT DOCUMENTS

| 1,933,461 | 10/1933 | Toll ........................................... 263/2 |
| 3,884,793 | 5/1975 | Penfold et al. ......................... 204/298 |
| 3,995,187 | 11/1976 | Penfold et al. ......................... 313/346 |
| 4,030,996 | 6/1977 | Penfold et al. ......................... 204/192 |
| 4,031,424 | 6/1977 | Penfold et al. ......................... 313/146 |
| 4,422,407 | 12/1983 | Bessot et al. ........................... 118/723 |
| 4,573,431 | 3/1986 | Sarkozy ................................. 118/725 |
| 4,606,650 | 8/1986 | Harris ...................................... 374/14 |
| 4,794,220 | 12/1988 | Sekiya .............................. 219/10.491 |
| 4,854,266 | 8/1989 | Simson et al. ......................... 118/728 |
| 5,073,241 | 12/1991 | Watanabe ........................ 204/192.15 |
| 5,118,289 | 6/1992 | Bergman et al. ..................... 432/205 |
| 5,377,297 | 12/1994 | Nuutinen .............................. 392/307 |

(List continued on next page.)

FOREIGN PATENT DOCUMENTS

| 0 410 442 A1 | 1/1991 | (EP) . |
| 0 832 863 A2 | 4/1998 | (EP) . |
| 0 846 787 A1 | 6/1998 | (EP) . |

OTHER PUBLICATIONS

European Search Report for EP0832 863 A3, published Apr. 4, 1998 in Bulletin 1998/18, 2 pages.
European Search Report for EP0011 2047 dated Oct. 4, 2000, 4 pages.
*IBM Technical Disclosure Bulletin*, "Adjustable Flat Gas–Inlet Detector," Dec. 1987, pp. 41–42, taken from http://www.delphion.com.

(List continued on next page.)

*Primary Examiner*—Gregory Wilson
(74) *Attorney, Agent, or Firm*—Kevin Leffel; Helen A. Odar

(57) ABSTRACT

The invention relates to a susceptor lid for use in a CVI/CVD furnace. More specifically, the invention is directed to a lid configured to consecutively run CVI/CVD and heat treatment processes without opening the furnace. The susceptor lid according to the invention comprises: a susceptor lid body having a gas exhaust hole, the susceptor lid body having a top surface and a bottom surface; and an exhaust lid disposed over the gas exhaust hole, with a clearance between the exhaust lid and the gas exhaust hole such that exhaust gas pressure within the clearance is approximately equal to, or less than the exhaust gas pressure within the gas exhaust hole, the exhaust lid being positioned to block the majority of the radiation from below the bottom surface of the susceptor lid body.

15 Claims, 5 Drawing Sheets

U.S. PATENT DOCUMENTS

| | | | |
|---|---|---|---|
| 5,470,452 | 11/1995 | Dickey et al. | 204/298.21 |
| 5,480,678 | 1/1996 | Rudolph et al. | 427/248.1 |
| 5,625,170 | 4/1997 | Poris | 177/50 |
| 5,725,746 | 3/1998 | Dickey et al. | 204/298.21 |
| 5,853,485 | 12/1998 | Rudolph et al. | 118/715 |
| 5,900,297 | 5/1999 | Rudolph et al. | 428/66.2 |
| 5,910,006 | 6/1999 | Conroy et al. | 432/250 |

OTHER PUBLICATIONS

Kotlensky, W.V., "Deposition of Pyrolytic Carbon in Porous Solids," *Chemistry and Physics of Carbon*, vol. 9, pp. 173, 186–203 (1973).

Lackey, W.J., "Review, Status, and Future of the Chemical Vapor Infiltration Process for Fabrication of Fiber–Reinforced Ceramic Composites", *Ceram. Eng. Sci. Proc.*, 10[7–8] 577–81 (1989).

Linke, J. and Vietzke, E., "Behavior of Boron Doped Graphites, Plasma–Sprayed $B_4C$, and a–C/B:H as Plasma–Facing Materials," *Fusion Technology* vol. 20, pp. 228–231, Sep. 1991.

Ponnekanti et al., "Failure mechanisms of anodized aluminum parts used in CVD chambers," *J. Vac. Sci. Technol.*, A14(3), pp. 1127–1131, May/Jun. 1996.

US 6,257,881 B1

COMBINATION CVI/CVD AND HEAT TREAT SUSCEPTOR LID

RELATED APPLICATIONS

This application is related to U.S. patent application Ser. No. 09/178,395. Furthermore, this application claims the benefit of and incorporates by reference provisional application U.S. application Ser. No. 60/137,591 file date Jun. 4, 1999.

BACKGROUND OF THE INVENTION

The invention relates to a susceptor lid for use in a CVI/CVD furnace. More specifically, the invention is directed to a lid configured to consecutively run CVI/CVD and heat treatment processes without opening the furnace between the processes.

Refractory composites are commonly subjected to heat treatment and CVI/CVD processes. According to prior art processes, different susceptor lids are used for each specific process because a CVI/CVD susceptor lid is provided with holes to enable gas flow, while the heat treatment susceptor lid is imperforate in order to prevent radiative heat transfer through the lid. Changing the lids is both time consuming and results in loss of radiation heat from the furnace. Therefore, a lid that may be used for both processes without opening the furnace is desired.

SUMMARY OF THE INVENTION

According to an aspect of the invention, a combined heat treat and CVI/CVD susceptor lid for a furnace susceptor, which allows exhaust gas to exit therefrom, is disclosed. The susceptor lid comprises: a susceptor lid body having a gas exhaust hole. The susceptor lid body has a top surface and a bottom surface. An exhaust lid is disposed over the gas exhaust hole, with a clearance between the exhaust lid and the gas exhaust hole such that exhaust gas pressure within the clearance is approximately equal to, or less than the exhaust gas pressure within the gas exhaust hole. The exhaust lid is positioned to block the majority of the radiation from below the bottom surface of the susceptor lid body.

DETAILED DESCRIPTION OF THE INVENTION

Figure 1:
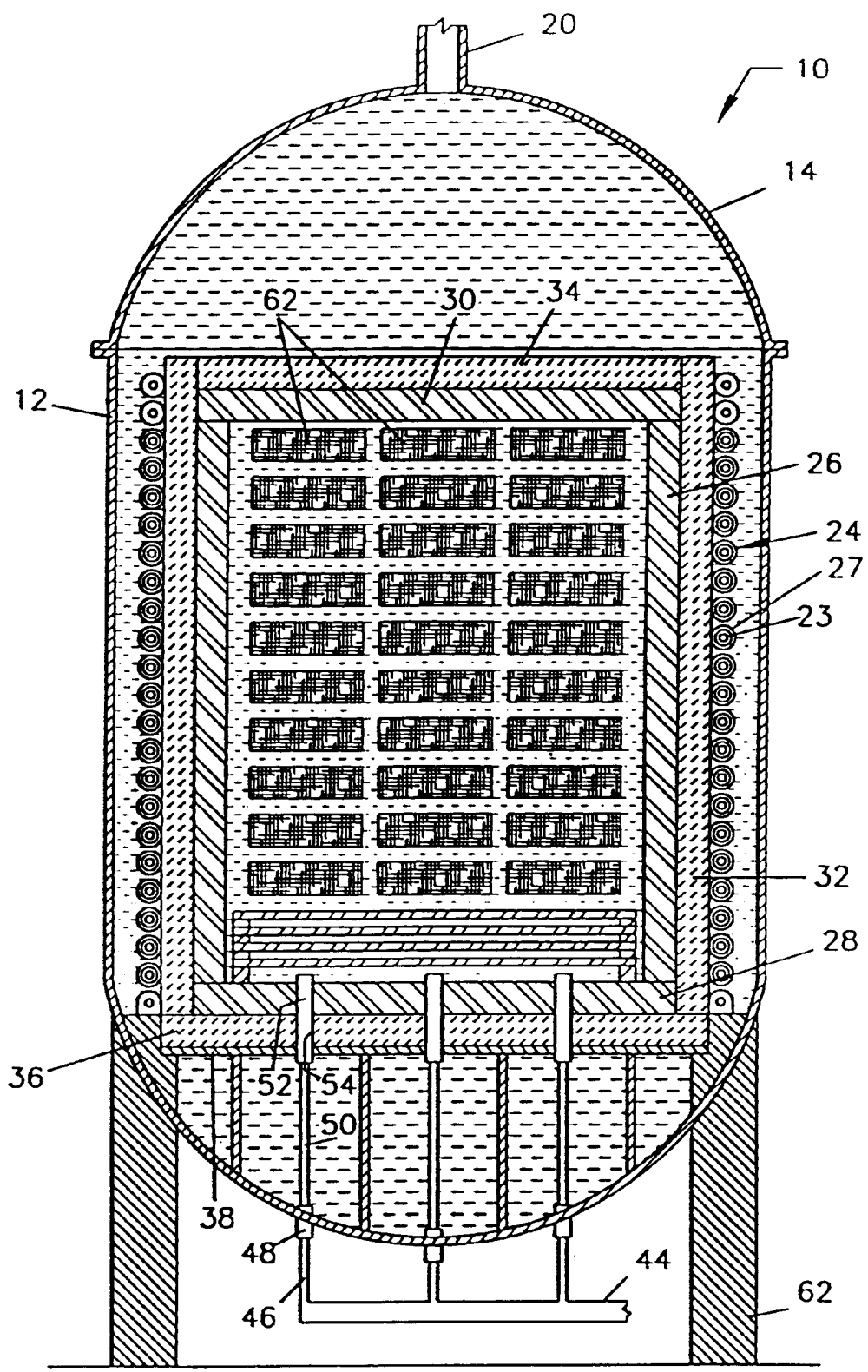
FIG. 1 presents a cross-sectional side view of a CVI/CVD furnace that implements a susceptor lid according to an aspect of the invention.

Various aspects of the invention are presented in FIGS. 1–8 which are not drawn to scale, and wherein like components are numbered alike. Referring now to FIG. 1, a cross-sectional view of a high temperature furnace 10 is presented, by way of example, that implements various aspects of the invention. Furnace 10 is configured to be employed with a high temperature process. As used herein, the term "high temperature" means a temperature substantially elevated above room temperature and in the range of 300° C. or greater. Refractory materials, generally, are manufactured and/or processed at temperatures greater than 300° C., and may be on the order of 900°–3000° C., or higher. For example, a porous carbon aircraft brake disk may have a pyrolytic carbon matrix deposited within it by a CVI/CVD process conducted at a temperature in the range of 900°–1100° C., and may be further heat-treated at a temperature up to 2200° C. or higher. Manufacturing and processing other types of ceramic materials may occur at other temperature ranges. Furnaces are commonly configured specifically for processing refractory composite materials using high temperature processes. Such processes include deposition of a binding matrix within a porous substrate, and heat treatment processes wherein refractory composite materials are heated for a defined period of time in order to alter some aspect of the material properties. Such processes are well known in the art.

Chemical vapor infiltration and deposition (CVI/CVD) for example, is a well-known process for depositing a binding matrix within a porous structure. The term "chemical vapor deposition" (CVD) generally implies deposition of a surface coating, but the term is also used to refer to infiltration and deposition of a matrix within a porous structure. As used herein, the term CVI/CVD is intended to refer to infiltration and deposition of a matrix within a porous structure. The technique is particularly suitable for fabricating high temperature structural composites by depositing a carbonaceous or ceramic matrix within a carbonaceous or ceramic porous structure resulting in very useful structures such as carbon/carbon aircraft brake disks, and ceramic combustor or turbine components. The generally known CVI/CVD processes may be classified into four general categories: isothermal, thermal gradient, pressure gradient, and pulsed flow. See W. V. Kotlensky, *Deposition of Pyrolytic Carbon in Porous Solids*, 8 Chemistry and Physics of Carbon, 173, 190–203 (1973); W. J. Lackey, *Review, Status, and Future of the Chemical Vapor Infiltration Process for Fabrication of Fiber-Reinforced Ceramic Composites*, Ceram. Eng. Sci. Proc. 10[7–8]577, 577–81 (1989) (W. J. Lackey refers to the pressure gradient process as "isothermal forced flow").

In an isothermal CVI/CVD process, a reactant gas passes around a heated porous structure at absolute pressures as low as a few torr. The gas diffuses into the porous structure driven by concentration gradients and cracks to deposit a binding matrix. This process is also known as "conventional" CVI/CVD. The porous structure is heated to a more or less uniform temperature, hence the term "isothermal."

In a thermal gradient CVI/CVD process, a porous structure is heated in a manner that generates steep thermal gradients that induce deposition in a desired portion of the porous structure. The thermal gradients may be induced by heating only one surface of a porous structure, for example by placing a porous structure surface against a susceptor wall, and may be enhanced by cooling an opposing surface, for example by placing the opposing surface of the porous structure against a liquid cooled wall. Deposition of the binding matrix progresses from the hot surface to the cold surface.

In a pressure gradient CVI/CVD process, the reactant gas is forced to flow through the porous structure by inducing a pressure gradient from one surface of the porous structure to an opposing surface of the porous structure. Flow rate of the reactant gas is greatly increased relative to the isothermal and thermal gradient processes which results in increased deposition rate of the binding matrix. This process is also known as "forced-flow" CVI/CVD. Finally, pulsed flow involves rapidly and cyclically filling and evacuating a chamber containing the heated porous structure with the reactant gas. The cyclical action forces the reactant gas to infiltrate the porous structure and also forces removal of the cracked reactant gas by-products from the porous structure.

Furnace 10 is generally cylindrical and comprises a shell 12 and a steel lid 14. The shell 12 can be made of steel. The lid also comprises a vacuum port 20. The furnace 10 also comprises a cylindrical induction coil 24 adjacent a cylindrical susceptor 26. The induction coil 24 comprises coiled conductors 23 encapsulated by electrical insulation 27. During operation, the induction coil 24 develops an electromagnetic field that couples with the susceptor 26 and generates heat within the susceptor 26. The susceptor 26 rests upon a susceptor floor 28 and is covered by a susceptor lid 30. A cylindrical insulation wall 32 is disposed in between the susceptor 26 and the induction coil 24. Lid insulation layer 34 and floor insulation layer 36 are disposed over the susceptor lid 30 and beneath the susceptor floor 28, respectively. A reactant gas is supplied to the furnace 10 by a main gas supply line 44. If desired, a mixture of reactant gases can be used. In such instance, a multitude of individual gas supply lines 46 are connected in fluid communication with a multitude of gas ports 48 that pass through the shell 12. A multitude of flexible gas supply lines 50 are connected in fluid communication with the gas ports 48 and a multitude of gas inlets 52 that pass through holes 54 in the furnace floor 38, the floor insulation layer 36, and the susceptor floor 28. A multitude of porous substrates 62, for example brake disks, are stacked within the furnace 10 inside the susceptor 26 on fixtures (not shown for clarity). Suitable fixtures are well known in the art.

The furnace and fixture configuration may vary substantially depending upon the type of process used, and the various aspects of the invention may be implemented with any of these processes, depending upon the particular configuration. As such, the furnace configuration of FIG. 1 is presented by way of example, and is not intended to limit the invention to the specific arrangement presented.

Figure 2:
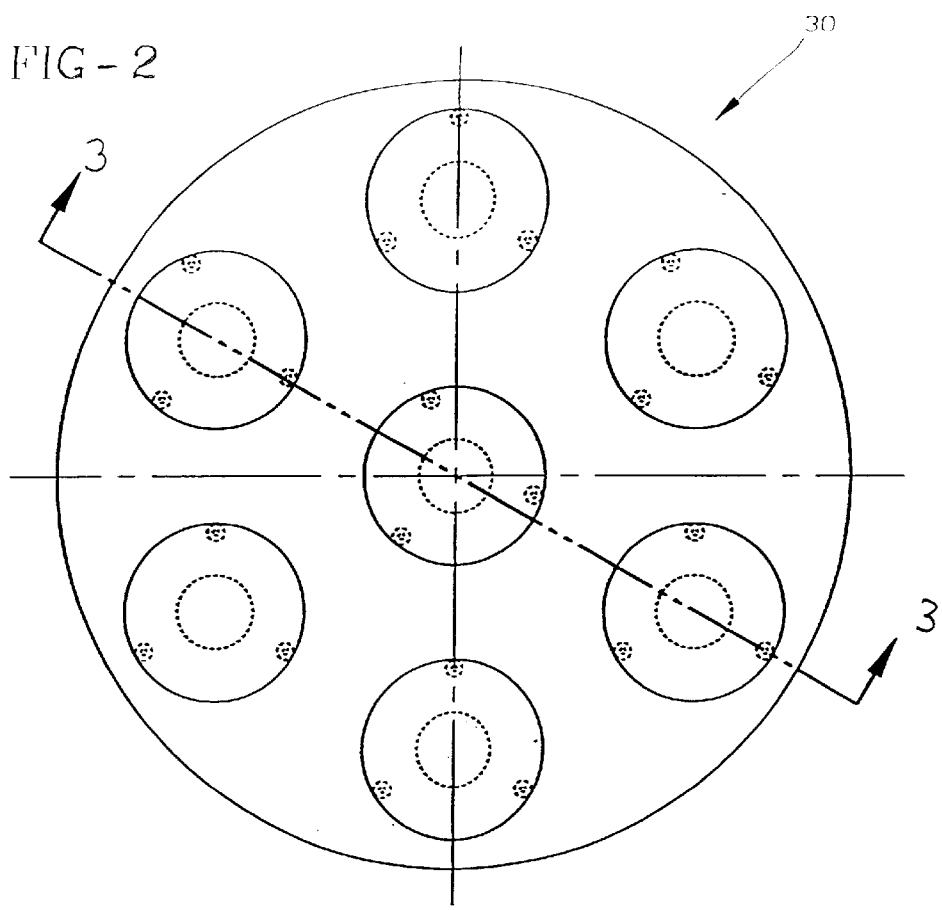
FIG. 2 presents a top view of a susceptor lid according to an aspect of the invention.
Figure 3:
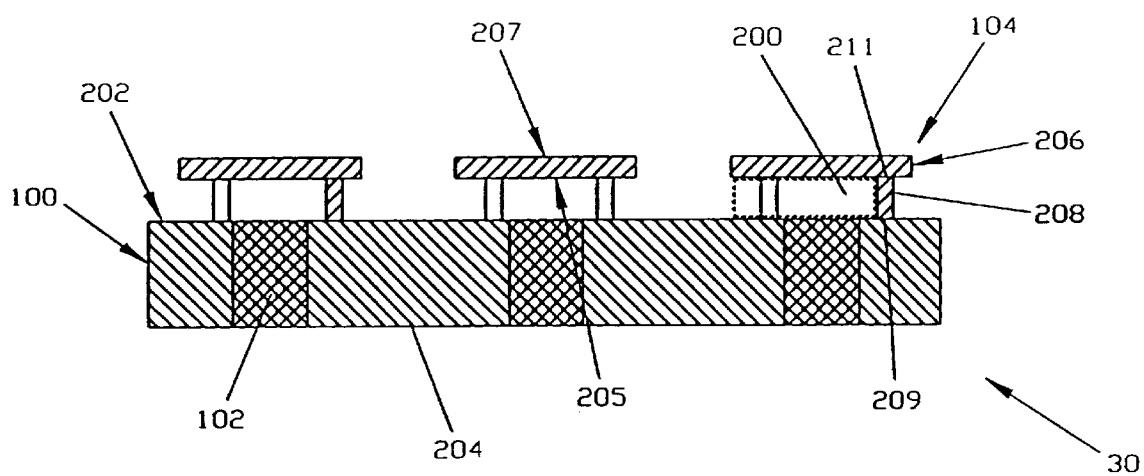
FIG. 3 presents a cross-sectional side view of the susceptor lid depicted in FIG. 2 taken along line 3—3 of FIG. 2.

Referring now to FIGS. 2 and 3, a top view and a cross-sectional view of the susceptor lid 30 are provided, according to an aspect of the invention. The susceptor lid 30 comprises a susceptor lid body 100 having a gas exhaust hole 102 and an exhaust lid 104 disposed over the gas exhaust hole 102. The susceptor lid body 100 has a top surface 202 and a bottom surface 204. There is a clearance 200, defined by the dashed line, between the exhaust lid 104 and the gas exhaust hole 102, and between the exhaust lid 104 and the susceptor lid body top surface 202, such that the exhaust gas pressure within the clearance 200 is approximately equal to, or less than the exhaust gas pressure within the gas exhaust hole 102. The exhaust lid 104 is positioned over the gas exhaust hole 102 to block the majority of the radiation from below the susceptor lid body bottom surface 204. The gas exhaust hole 102 allows reactant gas introduced into the furnace 10 through the gas inlets 52 to pass through the susceptor lid 30 to the vacuum port 20. According to a preferred embodiment, the exhaust lid 104 is positioned over the gas exhaust hole 102 such that there is no line of sight from above the susceptor lid body top surface 202 to below the susceptor lid body bottom surface 204. In another preferred embodiment the exhaust lid 104 comprises a disk 206 with a top surface 207 and bottom surface 205, and posts 208 which support the disk 206, and which have opposing ends, wherein the bottom surface of the disk 205 is resting on one end 211 of the post 208, and the opposing end 209 of the post 208 is resting on the top surface of the susceptor lid body 202. The disk 206, posts 208 and susceptor lid body 100 may be secured to each other by screws, bolts, posts, or any other appropriate means. In a further preferred embodiment, the susceptor lid body 100 comprises a plurality of gas exhaust holes 102 and a plurality of exhaust lids 104 disposed over the gas exhaust holes 102, each gas exhaust hole 102 having a corresponding exhaust lid 104 disposed over the gas exhaust hole 102, with a clearance 200 between the exhaust lids 104 and the gas exhaust holes 102, and between the exhaust lid 104 and the susceptor lid body top surface 202, such that exhaust gas pressure within the clearance 200 is approximately equal to, or less than the exhaust gas pressure within the corresponding gas exhaust holes 102. The exhaust lids 104 are positioned to block the majority of the radiation from below the susceptor lid body bottom surface 204. In another embodiment, the exhaust lids 104 are positioned such that there is no line of sight radiation from above the susceptor lid body top surface 202, to below the susceptor lid body bottom surface 204.

Figure 4:
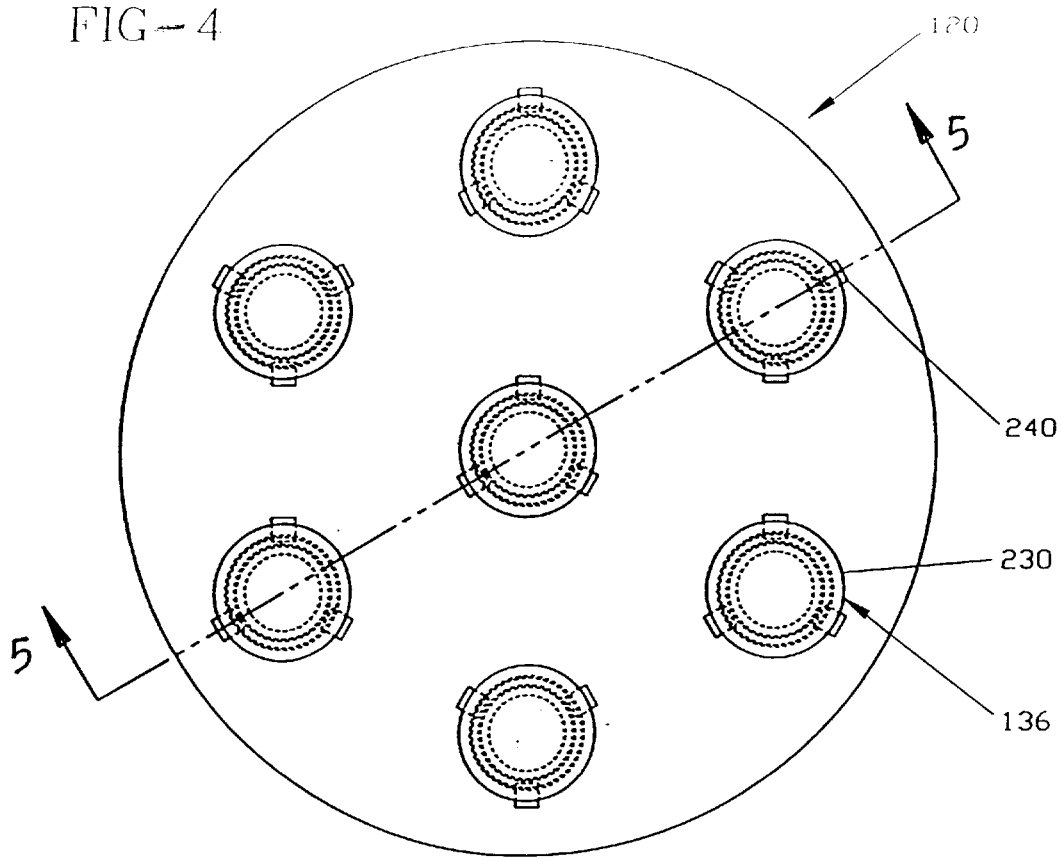
FIG. 4 presents a top view of a susceptor lid according to an aspect of the invention.
Figure 5:
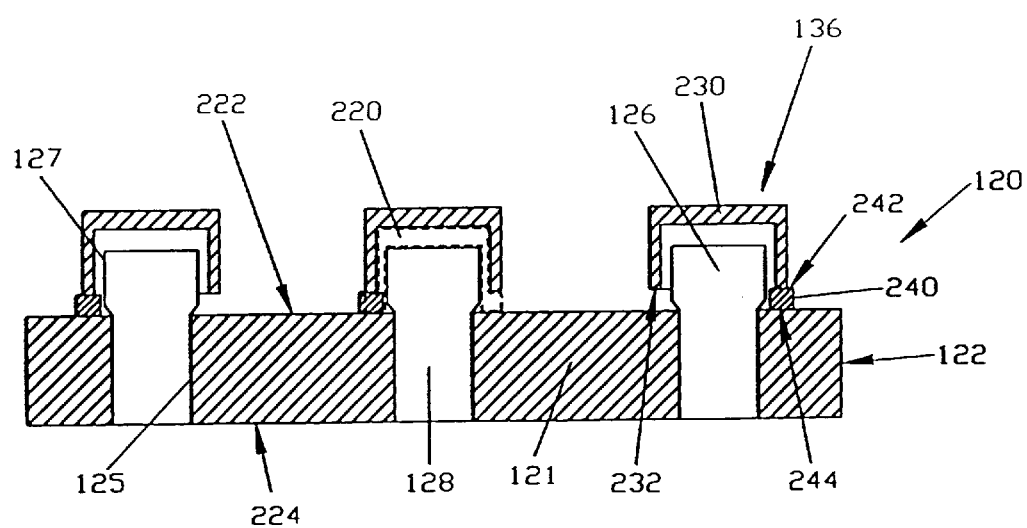
FIG. 5 presents a cross-sectional view of the susceptor lid depicted in FIG. 4 taken along line 5—5 of FIG. 4.

Referring now to FIGS. 4 and 5, a top view and a cross-sectional view of a susceptor lid 120 are provided, according to an aspect of the invention. The susceptor lid 120 comprises a susceptor lid body 122 having a top surface 222 and a bottom surface 224, and having a gas exhaust hole 128 and an exhaust lid 136 disposed over the gas exhaust hole 128. The susceptor lid body 122 comprises a susceptor plate 121 and an exhaust stack cap 126 with opposing ends, wherein one exhaust stack cap end 125 encircles the gas exhaust hole 128, and the opposing exhaust stack cap end 127 extends above the susceptor lid body top surface 222. The exhaust lid 136 comprises a stud 230 having a bottom surface 232, and spacers 240 having a top surface 242 and a bottom surface 244. The spacers 240 support the stud 230 above the susceptor lid body 122, wherein the stud bottom surface 232 is resting on the spacer top surface 242, and wherein the spacer bottom surface 244 is resting on the susceptor lid body top surface 222. The exhaust lid 136 is disposed over the opposing exhaust stack cap end 127. There is a clearance 220 between the exhaust lid 136 and the exhaust stack cap 126, and between the exhaust lid 136 and the susceptor lid body top surface 222, such that the exhaust gas pressure within the clearance 220 is approximately equal to, or less than the exhaust gas pressure within the gas exhaust hole 128. The exhaust lid 136 is positioned over the gas exhaust hole 128 to block the majority of the radiation from below the susceptor lid body bottom surface 224.

Figure 6:
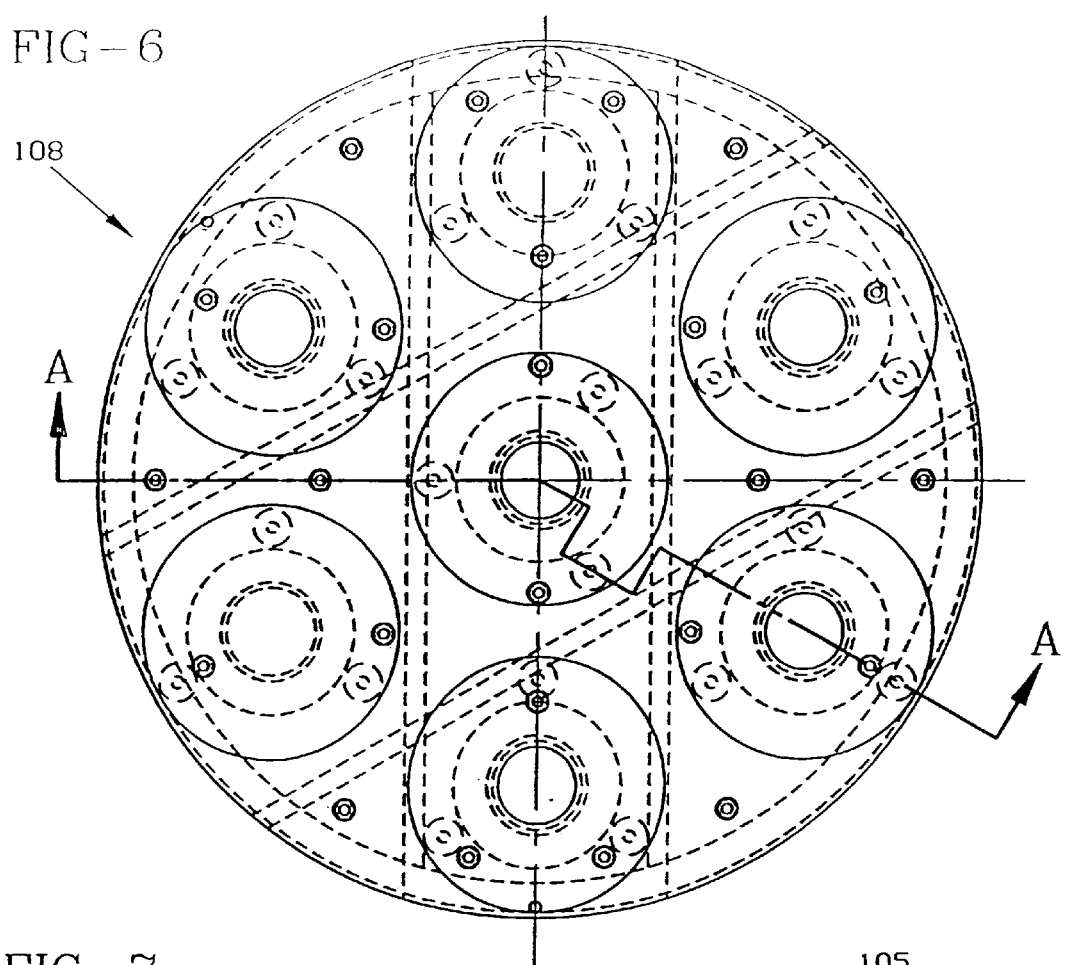
FIG. 6 presents a top view of a susceptor lid according to a preferred embodiment of the invention.
Figure 7:
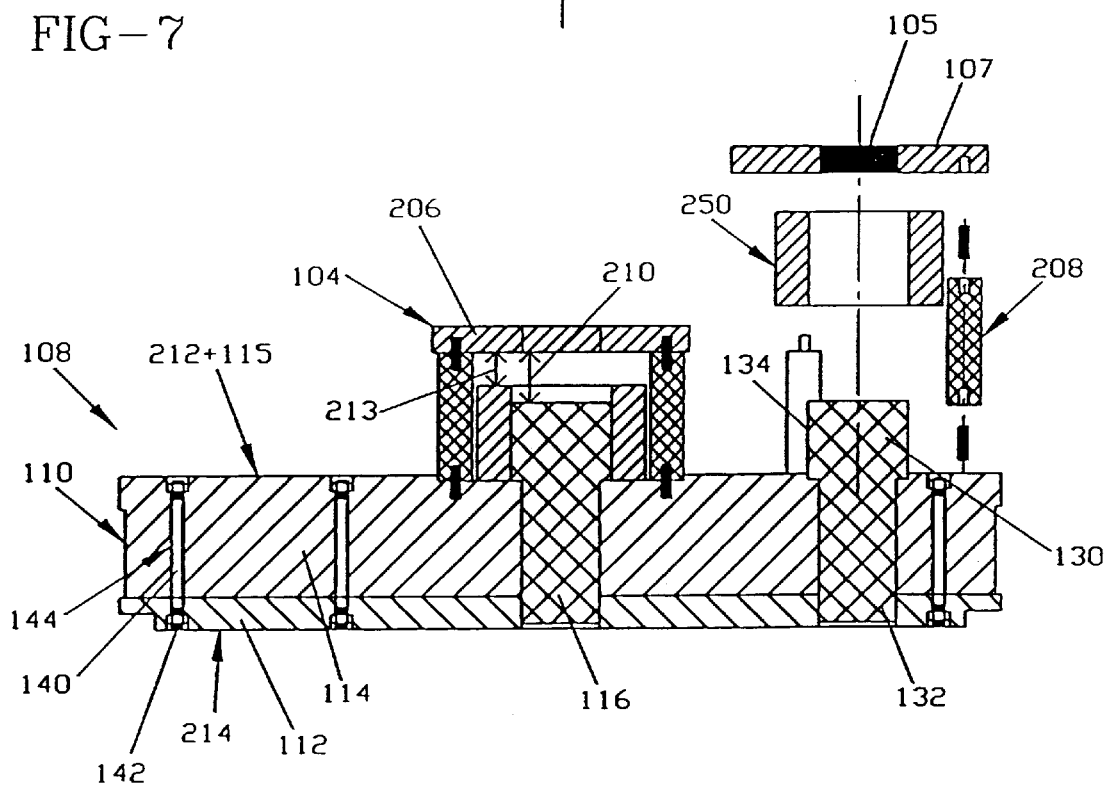
FIG. 7 presents a cross-sectional view taken along line A—A of the susceptor lid depicted in FIG. 6.
Figure 8:
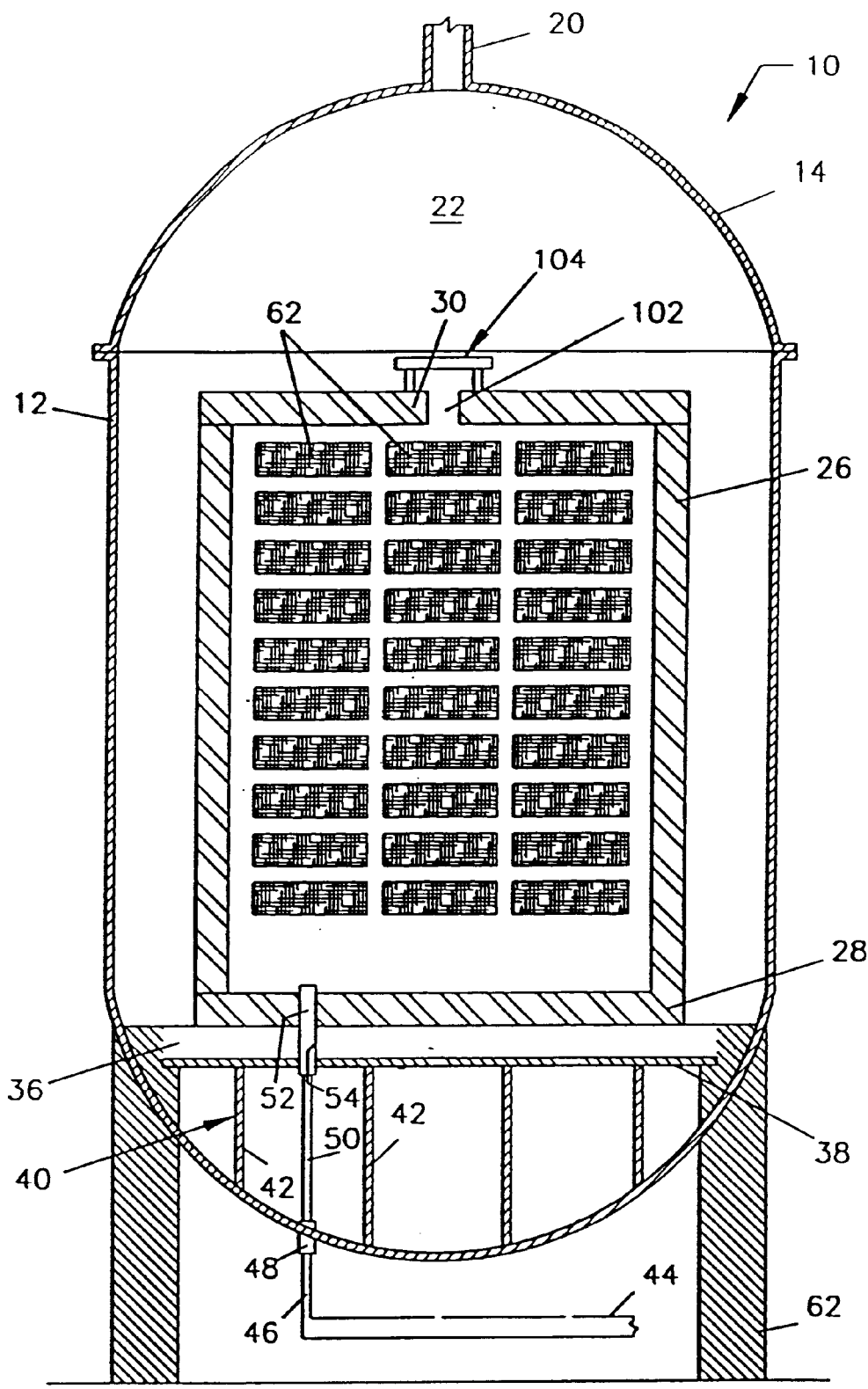
FIG. 8 presents a cross-sectional side view of a CVI/CVD furnace that implements the susceptor lid of the instant invention.

Referring now to FIGS. 6, 7, and 8, a susceptor lid 108 is presented according to a certain preferred embodiment, which features various aspects of the invention that may be employed alone or in combination. FIG. 6 presents a top view of the susceptor lid 108, and FIG. 7 presents a cross-section of the susceptor lid 108 as indicated by line A—A of FIG. 6. The susceptor lid 108 comprises a susceptor lid body 110 that comprises a susceptor plate 112 and an insulation layer 114 overlying the susceptor plate 112. A gas exhaust hole 116 is provided through the susceptor plate 112 and the insulation layer 114, and an exhaust lid 104 is disposed over the gas exhaust hole 116. The susceptor lid body 110 has a top surface 212 and a bottom surface 214. The exhaust lid 104 is positioned over the gas exhaust hole 116 to block the majority of the radiation from below the susceptor lid body bottom surface 214. A plurality of gas exhaust holes 116 and corresponding exhaust lids 104 are preferably provided. In a preferred embodiment the susceptor lid body 110 further comprises a gas exhaust tube 130 with opposing ends, wherein one end 132 encircles the gas exhaust hole 116, and the opposing end 134 extends above the susceptor lid body top surface 212. In this embodiment the exhaust lid 104 is disposed over the opposing end 134 of the gas exhaust tube 130, with a clearance 210 between the gas exhaust tube 130 and the exhaust lid 104 such that exhaust gas pressure within the clearance 210 is approximately equal to, or less than the exhaust gas pressure within the gas exhaust hole 116. In a further embodiment of the invention an insulation sleeve 250 encircles the portion of the gas exhaust tube which extends above the susceptor lid body top surface 212, with a clearance 213 between the insulation sleeve 250 and the exhaust lid 104 such that the exhaust gas pressure within the clearance 213 is approximately equal to, or less than the exhaust gas pressure within the gas exhaust hole.

In a further preferred embodiment at least one of the exhaust lids 107 has a through hole 105 which is smaller than the gas exhaust hole 116, and where the center of the through hole 105 is centered above the corresponding gas exhaust hole 116. These through holes are used to sight targets within the stacks of porous substrates, to determine the temperature in the center of the stacks during the CVI/CVD and heat-treat processes. This is necessary because the temperatures are too high for standard thermocouples. The susceptor plate 112 is made from a material that interacts with the susceptor coil magnetic field in the same manner as the susceptor 26 of FIG. 1. The insulation layer 114 may superpose the susceptor plate 112 and be attached thereto, and may define an exposed upper surface 115 having sufficient rigidity to permit furnace service personnel to walk on the exposed upper surface 114 without damaging the insulation layer 114.

The susceptor plate 112, and insulation layer 114 are superposed and held together by a multitude of tie-rods 140 and nuts 142 threaded onto the tie-rods 140. The tie-rods 140 closest to the periphery are provided with a threaded hole 144 into which a threaded eye-bolt (not shown) may be inserted for lifting and moving the susceptor lid 120. The threaded eye-bolts are typically removed during a CVI/CVD or heat treatment process since they are metal and can melt during such processing.

Methods according to various aspects of the invention are also provided. Referring to FIG. 8, a CVI/CVD method is provided, comprising the steps of heat treating the porous substrate 62 disposed within the susceptor 26 within the CVI/CVD furnace 10 to an elevated temperature, the susceptor 26 having a susceptor lid 30 with at least one gas exhaust hole 102; passing a flow of reactant gas into the CVI/CVD furnace 10; exposing the porous substrate 62 to the reactant gas wherein the reactant gas decomposes and deposits a binding matrix within the substrate 62; exhausting the flow of reactant gas through a gas exhaust hole 102 in the susceptor lid 30, while blocking the majority of radiation with an exhaust lid 104, positioned over the exhaust hole 102 such that the flow of reactant gas flows freely. A multitude of substrates 62 may be disposed within the CVI/CVD furnace, wherein each of the above steps is performed upon the multitude of substrates 62.

According to a certain embodiment for CVI/CVD processing and heat treating carbon/carbon aircraft brake disks, the susceptor lid 108 is employed. The susceptor plate 112 is manufactured from monolithic graphite having suitable suscepting properties, such as CS grade graphite, available from UCAR Carbon Company Inc., United States of America, or HLM grade graphite, available from SGL Carbon Corporation, United States of America. The gas exhaust tubes 130 are manufactured from monolithic graphite, such as the CS grade graphite or HLM grade graphite materials just described. The tie rods 140 and nuts 142 are manufactured from monolithic graphite, such as ATJ grade, available from UCAR Carbon Company Inc. The outer tie rods 140 having threaded holes 144 are manufactured from a monolithic graphite having a greater strength, such as grade ATJ or CGW, available from UCAR Carbon Company Inc., since these are the lift points for moving the entire lid. The insulation layer 114 is manufactured from a rigid carbon felt, such as Calcarb CBCF material, available from Calcarb, Ltd., Scotland, or Fibergraph® material, available from SIGRI Polycarbon, Inc., United States of America. All exterior surfaces of the rigid carbon felt components are painted with a graphite paint, such as TC-2 graphite paint, available from EGC Enterprises Inc., United States of America, and then further sealed with an additional coat of phenolic based paint, such as Rigidseal® paint, available from SIGRI Polycarbon, Inc. The outside curcumferential surface of the insulation layer 114, and the inside surface of the gas exhaust tube 130 are coated with a graphite foil sheet, such as Grafoil® material available from UCAR Carbon Company Inc., or Calgraph® material, available from SIGRI Polycarbon, Inc., bonded in place using a graphite adhesive, such as Graphi-Bond 669 adhesive, available from Aremco Products Inc., United States of America. A sheet of graphite foil may optionally be bonded to the top surface of the second insulation layer, but is not necessary since the graphite foam coated as described herein is sufficiently abrasion resistant to permit furnace service personnel to walk on its surface.

Although the invention has been described and illustrated with reference to specific illustrative embodiments thereof, it is not intended that the invention be limited to those illustrative embodiments. Those skilled in the art will recognize that variations and modifications can be made without departing from the true scope and spirit of the invention as defined by the claims that follow. It is therefore intended to include within the invention all such variations and modifications as fall within the scope of the appended claims and equivalents thereof.

What is claimed is:

1. A combined heat treat and CVI/CVD susceptor lid for a furnace susceptor, which allows exhaust gas to exit therefrom, comprising:

a susceptor lid body having a gas exhaust hole, said susceptor lid body having a top surface and a bottom surface; and, an exhaust lid disposed over said gas exhaust hole, with a clearance between said exhaust lid and said gas exhaust hole such that exhaust gas pressure within said clearance is approximately equal to, or less that the exhaust gas pressure within said gas exhaust hole, said exhaust lid being positioned to block the majority of the radiation from below said susceptor lid body bottom surface.

2. The apparatus of claim 1, wherein said exhaust lid is positioned such that there is no line of sight from above said susceptor lid body top surface to below said susceptor lid body bottom surface.

3. The apparatus of claim 1 wherein said exhaust lid comprises:
   a disk having a top and a bottom surface; and,
   posts which support said disk resting on one end of said post, and the opposing end of said post is resting on said top surface of said susceptor lid body.

4. The apparatus of claim 1 wherein said susceptor lid body comprises a susceptor plate and an exhaust stack cap with opposing ends, wherein one end encircles said gas exhaust hole, and the opposing end extends above said susceptor lid body top surface, and wherein said exhaust lid comprises a stud having a bottom surface, and spacers having a top and bottom surface, supporting said stud above said susceptor lid body, wherein said stud bottom surface is resting on said spacer top surface, and wherein said spacer bottom surface is resting on said susceptor lid body top surface, and wherein said exhaust lid is disposed over said opposing end of said exhaust stack cap, with a clearance between said exhaust stack cap and said exhaust lid and between said exhaust lid and said susceptor lid body top surface, such that exhaust gas pressure within said clearance is approximately equal to, or less than the exhaust gas pressure within said gas exhaust hole, said exhaust lid being positioned to block the majority of the radiation from below said susceptor lid body bottom surface.

5. The apparatus of claim 1, wherein said susceptor lid body comprises:
   a susceptor plate; and
   a gas exhaust tube with opposing ends, wherein one end encircles said gas exhaust hole, and the opposing end extends above said susceptor lid body top surface, and wherein said exhaust lid is disposed over said opposing end of said gas exhaust tube, with a clearance between said gas exhaust tube and said exhaust lid and between said exhaust lid and said susceptor lid body top surface, such that exhaust gas pressure within said clearance is approximately equal to, or less than the exhaust gas pressure within said gas exhaust hole, said exhaust lid being positioned to block the majority of the radiation from below said susceptor lid body bottom surface.

6. The apparatus of claim 1, wherein said susceptor lid body comprises:
   a susceptor plate;
   a gas exhaust tube with opposing ends, wherein one end encircles said gas exhaust hole, and the opposing end extends above said susceptor lid body top surface, and wherein said exhaust lid is disposed over said opposing end of said gas exhaust tube, with a clearance between said gas exhaust tube and said exhaust lid such that exhaust gas pressure within said clearance is approximately equal to, or less than the exhaust gas pressure within said gas exhaust hole, said exhaust lid being positioned to block the majority of the radiation from below said susceptor lid body bottom surface; and,
   an insulation sleeve which encircles the portion of said gas exhaust tube which extends above said susceptor lid body top surface.

7. The apparatus of claim 1, wherein said exhaust lid has a through hole smaller than said gas exhaust hole, the center of said through hole being centered over said gas exhaust hole.

8. The apparatus of claim 1, wherein said susceptor lid body comprises a susceptor plate and an insulation layer overlying said susceptor plate.

9. The apparatus of claim 1, wherein said susceptor lid body comprises a susceptor plate and an insulation layer overlying said susceptor plate, wherein said insulation layer defines an exposed upper surface and has sufficient rigidity to permit furnace service personnel to walk on said exposed surface without damaging said insulation layer.

10. A combined heat treat and CVI/CVD susceptor lid for a furnace susceptor, which allows exhaust gas to exit therefrom, comprising:
    a susceptor lid body having a plurality of gas exhaust holes, said susceptor lid body having a top surface and a bottom surface; and,
    a plurality of exhaust lids disposed over said gas exhaust holes, each gas exhaust hole having a corresponding exhaust lid disposed over said gas exhaust hole, with a clearance between said exhaust lids and said gas exhaust holes such that exhaust gas pressure within said clearance is approximately equal to, or less than the exhaust gas pressure within the corresponding gas exhaust holes, said exhaust lids being positioned to block the majority of the radiation from below said susceptor lid body bottom surface.

11. The apparatus of claim 10 wherein at least one said exhaust lid has a through hole smaller than said gas exhaust holes, the center of said through hole being centered over said gas exhaust hole.

12. The apparatus of claim 10, wherein said exhaust lids are positioned such that there is no line of sight from above said susceptor lid body top surface to below said susceptor lid body bottom surface.

13. In combination, a CVI/CVD and heat treat furnace comprising a susceptor and a susceptor lid, which allows exhaust gas to exit therefrom, said susceptor lid comprising a susceptor plate having a top and a bottom surface and having a gas exhaust hole, and an exhaust lid disposed over said gas exhaust hole, with a clearance between said exhaust lid and said gas exhaust hole such that exhaust gas pressure within said clearance is approximately equal to, or less than the exhaust gas pressure within said gas exhaust hole, said exhaust lid being positioned to block the majority of the radiation from below said susceptor plate bottom surface.

14. A CVI/CVD method, comprising the steps of:
    heat treating a substrate disposed within a susceptor within a CVI/CVD furnace to an elevated temperature, said susceptor having a susceptor lid with at least one gas exhaust hole;
    passing a flow of reactant gas into said CVI/CVD furnace;
    exposing said substrate to said reactant gas wherein said reactant gas decomposes and deposits a binding matrix within said substrate; and,
    exhausting said flow of reactant gas through said gas exhaust hole, while blocking the majority of radiation with an exhaust lid, positioned over said gas exhaust hole such that said flow of reactant gas flows freely.

15. The method of claim 14, wherein a multitude of substrates are disposed within said CVI/CVD furnace, and are subjected to said steps.

* * * * *